(12) United States Patent
Reznicek et al.

(10) Patent No.: US 9,070,771 B2
(45) Date of Patent: Jun. 30, 2015

(54) BULK FINFET WITH CONTROLLED FIN HEIGHT AND HIGH-K LINER

(71) Applicant: International Business Machines Corporation, Armonk, NY (US)

(72) Inventors: Alexander Reznicek, Troy, NY (US); Thomas N. Adam, Slingerlands, NY (US); Kangguo Cheng, Guilderland, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/460,921

(22) Filed: Aug. 15, 2014

(65) Prior Publication Data

US 2014/0353721 A1 Dec. 4, 2014

Related U.S. Application Data

(62) Division of application No. 13/604,658, filed on Sep. 6, 2012, now Pat. No. 8,841,188.

(51) Int. Cl.
*H01L 29/78* (2006.01)
*H01L 29/06* (2006.01)
*H01L 21/8238* (2006.01)
*H01L 27/092* (2006.01)
*H01L 29/66* (2006.01)
*H01L 29/10* (2006.01)

(52) U.S. Cl.
CPC ...... *H01L 29/785* (2013.01); *H01L 21/823821* (2013.01); *H01L 27/0924* (2013.01); *H01L 29/66795* (2013.01); *H01L 29/1054* (2013.01); *H01L 29/0684* (2013.01)

(58) Field of Classification Search
CPC .................................................. H01L 29/66795
USPC ........................................................ 257/192
See application file for complete search history.

(56) References Cited

U.S. PATENT DOCUMENTS 7,646,071 B2    1/2010   Ban et al.
7,829,951 B2    11/2010  Song et al.
(Continued)

OTHER PUBLICATIONS

Wu, C. C., et al., "High Performance 22/20nm FinFET CMOS Devices with Advanced High-K/Metal Gate Scheme", Electron Devices Meeting (IEDM), 2010 IEEE International, Dec. 2010.

*Primary Examiner* — Mamadou Diallo
(74) *Attorney, Agent, or Firm* — Scully, Scott, Murphy & Presser, P.C.; H. Daniel Schnurmann

(57) ABSTRACT

A method of forming a semiconductor device that includes forming a material stack on a semiconductor substrate, the material stack including a first dielectric layer on the substrate, a second dielectric layer on the first dielectric layer, and a third dielectric layer on the second dielectric layer, wherein the second dielectric layer is a high-k dielectric. Openings are formed through the material stack to expose a surface of the semiconductor substrate. A semiconductor material is formed in the openings through the material stack. The first dielectric layer is removed selectively to the second dielectric layer and the semiconductor material. A gate structure is formed on a channel portion of the semiconductor material. In some embodiments, the method may provide a plurality of finFET or trigate semiconductor device in which the fin structures of those devices have substantially the same height.

14 Claims, 5 Drawing Sheets

(56) References Cited

U.S. PATENT DOCUMENTS

| | | |
|---|---|---|
| 7,927,938 B2 | 4/2011 | El-Kareh et al. |
| 7,933,142 B2 | 4/2011 | Okhonin et al. |
| 7,940,559 B2 | 5/2011 | Carman |
| 7,947,543 B2 | 5/2011 | Kim |
| 7,957,206 B2 | 6/2011 | Bauser |
| 7,969,779 B2 | 6/2011 | Fisch et al. |
| 8,014,195 B2 | 9/2011 | Okhonin et al. |
| 8,497,171 B1 * | 7/2013 | Wu et al. .................. 438/218 |
| 8,502,263 B2 * | 8/2013 | Li et al. .................. 257/103 |
| 8,580,642 B1 * | 11/2013 | Maszara et al. .................. 438/283 |
| 8,629,478 B2 * | 1/2014 | Ko et al. .................. 257/192 |
| 2006/0234456 A1 * | 10/2006 | Anderson et al. .................. 438/284 |
| 2007/0176223 A1 | 8/2007 | Chindalore et al. |
| 2009/0026523 A1 | 1/2009 | Wong et al. |
| 2010/0065925 A1 | 3/2010 | Huang et al. |
| 2010/0329043 A1 | 12/2010 | Fossum et al. |
| 2012/0292707 A1 | 11/2012 | Toh et al. |
| 2012/0309139 A1 * | 12/2012 | Liang et al. .................. 438/158 |
| 2013/0270641 A1 * | 10/2013 | Chi .................. 257/351 |

* cited by examiner

US 9,070,771 B2

1

BULK FINFET WITH CONTROLLED FIN HEIGHT AND HIGH-K LINER

BACKGROUND

The present disclosure relates generally to semiconductor devices. More particularly, the present disclosure relates to semiconductor devices including fin structures.

The integration of electronic microchip devices, such as resistors, capacitors, fuses, diodes and transistors on a silicon substrate is the basis for integrated circuit (IC) wafer fabrication technology. The most popular IC technology, complementary metal-oxide semiconductor (CMOS), revolves around the improvements that have been made in field effect transistor (FET) design and fabrication. In order to be able to make ICs, one has to find ways to further downscale the dimensions of FETs, such as MOSFETs and CMOS devices. Scaling achieves compactness and improves operating performance in devices by shrinking the overall dimensions and operating voltages of the device while maintaining the device's electrical properties. In view of scaling reaching its potential limits, increasing the application of fin structure field effect transistors (finFETs) and tri-gate field effect transistors has been contemplated.

SUMMARY

A method of fabricating a semiconductor device is provided. In one embodiment, the method may include forming a material stack on a semiconductor substrate. The material stack may include a first dielectric layer on the substrate, a second dielectric layer on the first dielectric layer, and a third dielectric layer on the second dielectric layer. The second dielectric layer may be a high-k dielectric. Openings can be formed through the material stack to expose a surface of the semiconductor substrate. A semiconductor material may be formed in the openings through the material stack. The third dielectric layer may be removed selective to the second dielectric layer and the semiconductor material. A gate structure may be formed on a channel portion of the semiconductor material.

In another aspect, a semiconductor device structure is provided. In one embodiment, the semiconductor device includes a semiconductor substrate of a first semiconductor material and a a plurality of punch through doped semiconductor structures in contact with the semiconductor substrate. Adjacent punch through doped semiconductor structures may be separated from one another by a dielectric isolation material. The semiconductor device structure may further include a plurality of fin structures of a second semiconductor material. Each fin structure of the plurality of fin structures may be present on a punch through doped semiconductor structure. Each fin structure of the plurality of fin structures has a substantially same height as measured from the surface of the semiconductor substrate. A gate structure may be present on a channel portion of said each fin structure of the plurality of fin structures.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
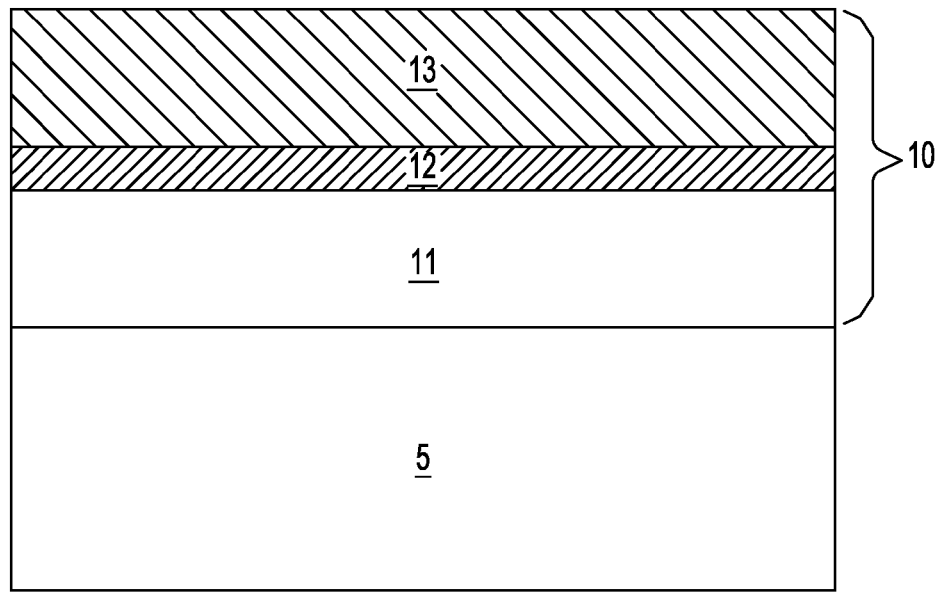
FIG. 1 is a side cross-sectional view depicting one embodiment of forming a material stack on a semiconductor substrate, in which the material stack includes a second dielectric layer of a high-k dielectric material, in accordance with the present disclosure.

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure. For purposes of the description hereinafter, the terms "upper", "lower", "vertical", "horizontal", "top", "bottom", and derivatives thereof shall relate to the disclosed structures, as it is oriented in the drawing figures.

Bulk finFET and tri-gate semiconductor devices employ fin structures. As used herein, a "fin structure" refers to a semiconductor material, which is employed as the body of a semiconductor device, in which the gate structure is positioned around the fin structure such that charge flows along the channel on the two sidewalls of the fin structure and optionally along the top surface of the fin structure. The fin height is typically defined by a timed etch, which can be susceptible to a large variation. Typically, the etch process that defines the fin height recesses the dielectric material that is separating adjacent fin structures. In other instances, filling isolation regions with a dielectric material can be difficult as the pitch between adjacent fin structures is continually reduced to provide smaller devices. The tight pitch in combination with the aspect ratio of the fin structures can cause non-uniformity in the fill for forming the isolation regions. Another consideration in forming semiconductor devices having fin structures is that a punch through stopper is typically desired to be present underneath the fin structures in order to electrically isolate the subsequently formed source and drain regions. Typically, the punch through stopper is formed by implanting a dopant through the fin structures into the underlying substrate, which can introduce dopant to the channel portion of the fin structures. It has been determined that this undesirable dopant can degrade the electrical performance of the device.

In some embodiments, the methods and structures disclosed herein provide an etch stop layer, e.g., embedded etch stop layer, that is used to ensure uniformity in the fin height of the fin structures. The etch stop layer is typically a high k dielectric layer, which in some embodiments can be hafnium oxide. In some embodiments, the disclosed methods provide for the material that provides the isolation regions to be formed before the fin structures, therefore overcoming the difficulty in filling high aspect ratio trenches with dielectric material. Further, the methods and structures disclosed herein can provide a punch through region before the forming the fin structures, and therefore can avoid introducing unwanted dopants to the channel portion of the fin structure.

FIG. 1 depicts one embodiment of forming a material stack 10 on a semiconductor substrate 5, in which the material stack 10 includes a first dielectric layer 11 that is present on the semiconductor substrate 5, a second dielectric layer 12 that is present on the first dielectric layer 11, and a third dielectric layer 13 that is present on the second dielectric layer 12. The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

The first dielectric layer 11 may be composed of an oxide, nitride or oxynitride material. In some embodiments, the first dielectric layer 11 is composed of silicon oxide ($SiO_2$). In other embodiments, the first dielectric layer 11 may be composed of silicon nitride or silicon oxynitride. It is noted that the above examples of dielectric materials for the first dielectric layer 11 are provided for illustrative purposes only, and are not intended to limit the present disclosure, as other dielectric materials may also be employed for the first dielectric layer 11. The first dielectric layer 11 may be formed using any deposition or thermal growth process. In one example, when the first dielectric layer 11 is composed of silicon oxide ($SiO_2$), the first dielectric layer 11 may be formed using thermal oxidation. In other examples, the first dielectric layer 11 may be formed using a deposition process, such as chemical vapor deposition (CVD). Variations of CVD processes that are suitable for forming the first dielectric layer 11 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. The first dielectric layer 11 may also be deposited using evaporation, chemical solution deposition, spin on deposition, and physical vapor deposition (PVD) methods. The first dielectric layer 11 may have a thickness ranging from 10 nm to 200 nm. In another embodiment, the first dielectric layer 11 may have a thickness ranging from 40 nm to 70 nm.

The second dielectric layer 12 that is formed on the first dielectric layer 11 is typically a high-k dielectric, such as a hafnium containing dielectric. As used herein, the term "high-k" means a material having a dielectric constant that is greater than silicon oxide ($SiO_2$) at room temperature (20° C-25° C.) and atmospheric pressure (1 atm). For example, and in some embodiments, the high-k dielectric material that is used for the second dielectric layer 12 has a dielectric constant that is greater than the 10, e.g., 10.1. In another example, the high-k dielectric material for the second dielectric layer 12 is comprised of a material having a dielectric constant greater than 15.0. In yet another embodiment, the high-k dielectric for the second dielectric layer 12 is comprised of a material having a dielectric constant ranging from 10 to 30. The dielectric constants mentioned herein are relative to a vacuum at room temperature, i.e., 20° C. to 25° C. Some examples of high-k dielectric materials suitable for the second dielectric layer 12 are hafnium containing dielectrics, such as hafnium oxide, hafnium silicon oxide, and hafnium silicon oxynitride. The second dielectric layer 12 may be formed using any deposition or thermal growth process. In one example, the second dielectric layer 12 may be formed using a deposition process, such as chemical vapor deposition (CVD). Variations of CVD processes that are suitable for forming the second dielectric layer 12 include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The second dielectric layer 12 may also be deposited using evaporation, chemical solution deposition, spin on deposition, and physical vapor deposition (PVD) methods. The second dielectric layer 12 may have a thickness ranging from 2 nm to 100 nm. In another embodiment, the second dielectric layer 12 may have a thickness ranging from 5 nm to 20 nm.

The third dielectric layer 13 may also be composed of any dielectric material, such as oxides, nitrides or oxynitrides. In one embodiment, the third dielectric layer 13 is composed of a nitride, such as silicon nitride. It is noted that the above examples of dielectric materials for the third dielectric layer 13 are provided for illustrative purposes only, and are not intended to limit the present disclosure, as other dielectric materials may also be employed for the third dielectric layer 13. Similar to the first dielectric layer 11 and the second dielectric layer 12, the third dielectric layer 13 may be formed using a deposition or growth process. Each of the deposition and growth processes that have been described for forming the first dielectric layer are suitable for forming the third dielectric layer 13. In one embodiment, the third dielectric layer 13 may have a thickness ranging from 10 nm to 100 nm. In another embodiment, the third dielectric layer 13 may have a thickness ranging from 20 nm to 40 nm.

Figure 2:
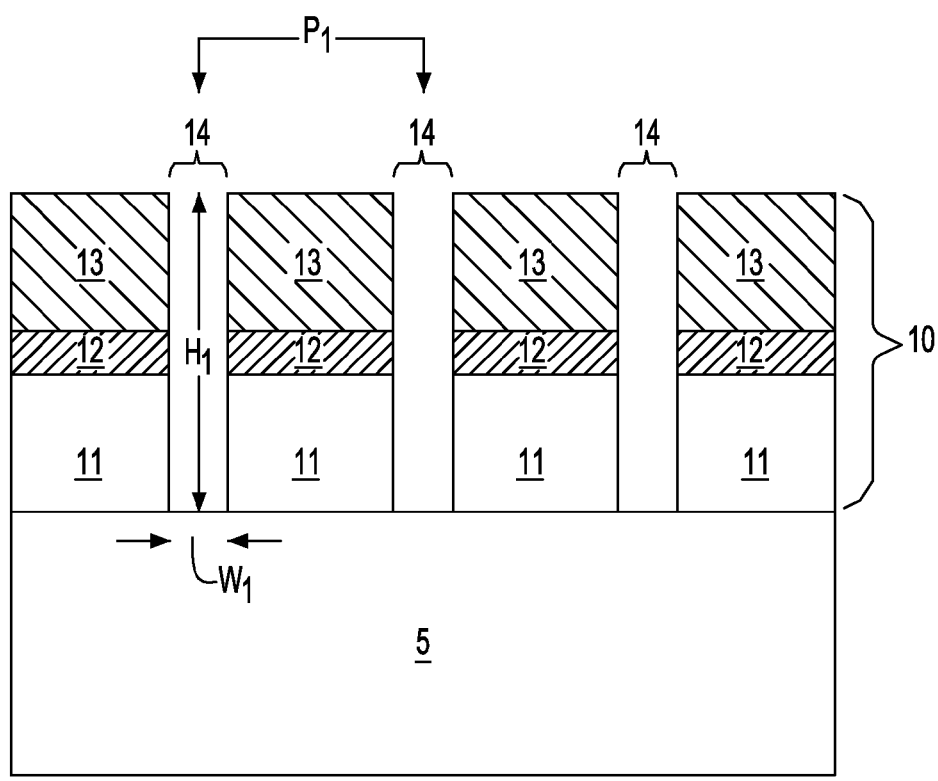
FIG. 2 is a side cross-sectional view depicting forming openings through the material stack to expose a surface of the semiconductor substrate, in accordance with one embodiment of the present disclosure.

FIG. 2 depicts one embodiment of forming openings 14 through the material stack 10 to expose a surface of the semiconductor substrate 5. The openings 14 that are formed through the material stack 10 dictate the position of the later formed semiconductor material that provides the fin structures. The openings 14 may be patterned and etched into the material stack 10 using spacer imaging transfer. More specifically, a spacer of a film layer can be formed on the sidewall of a previously patterned feature. The previously patterned feature may be a photoresist structure that is formed using photolithography. More specifically, a previously patterned feature is produced on the material stack 10 by applying a photoresist to the surface to be etched, exposing the photoresist to a pattern of radiation, and then developing the pattern into the photoresist utilizing a resist developer. The spacer is typically a hard mask material, such as silicon oxide, silicon nitride or silicon oxynitride. The spacer is formed by deposition of a film material on the previous patterned feature, followed by etching to remove all the film material for the spacer on the horizontal surfaces including the upper surface of the previously patterned feature, leaving only the material for the spacer on the sidewalls. The previously patterned feature may then be removed selectively to the spacer. By removing the original patterned feature, only the spacer is left. The remaining spacer provides an etch mask.

Following formation of the etch mask that is provided by the spacer over the material stack 10, an etch process is employed to etch the third dielectric layer 13, second dielectric layer 12 and the first dielectric layer 11 selective to the spacer and the semiconductor substrate 5. As used herein, the term "selective" in reference to a material removal process denotes that the rate of material removal for a first material is greater than the rate of removal for at least another material of the structure to which the material removal process is being applied. For example, a selective etch may remove one material to a second material at a rate that is greater than 10:1. In another example, a selective etch may remove one material to a second material at a rate that is greater than 100:1. In one embodiment, the etch process that etches the material stack 10 to provide the openings 14 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. Following etching to form the openings 14, the spacer that provides the most is removed.

In one embodiment, adjacent openings 14 are separated by a pitch P1 ranging from 20 nm to 100 nm. In another embodiment, adjacent openings 14 are separated by a pitch P1 ranging from 30 nm to 60 nm. In one embodiment, the height H1 of the openings 14 though the material stack 10 ranges from 30 nm to 250 nm. In another embodiment, the height H1 of the openings 14 though the material stack 10 ranges from 50 nm to 100 nm. In one embodiment, the width W1 of the openings 14 though the material stack 10 ranges from 2 nm to 20 nm. In another embodiment, the width W1 of the openings 14 though the material stack 10 ranges from 6 nm to 12 nm. The openings 14 through the material stack 10 can have an aspect ratio (height:width) ranging from 3:1 to 50:1. In another embodiment, the openings 14 through the material stack 10 can have an aspect ratio (height:width) ranging from 5:1 to 10:1.

Figure 3A:
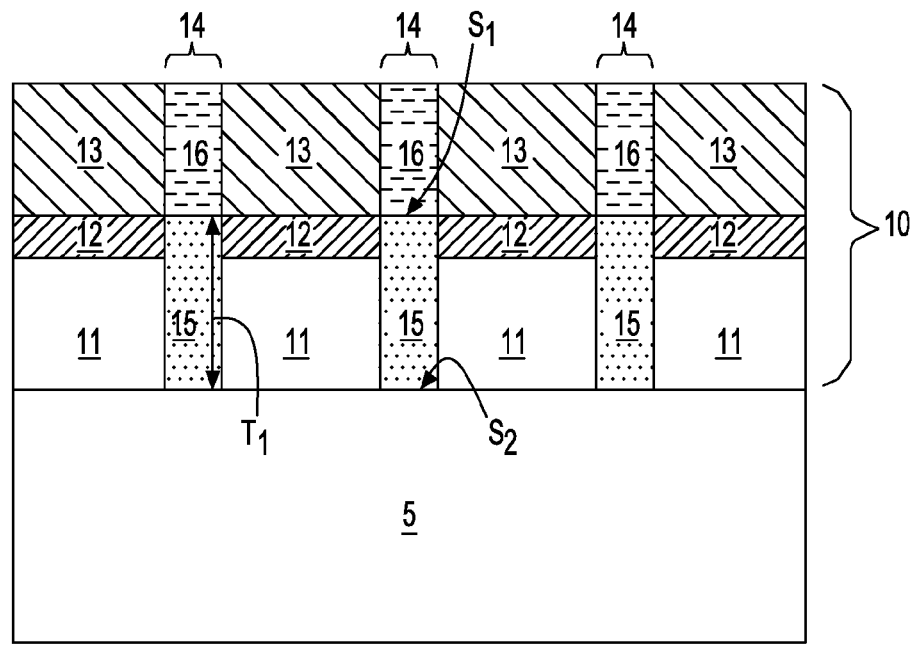
FIG. 3A is a side cross-sectional view depicting forming a semiconductor material in the openings through the material stack, in accordance with one embodiment of the present disclosure.

FIG. 3A depicts one embodiment of forming a semiconductor material in the openings 14 through the material stack 10. In one embodiment, forming the semiconductor material in the openings 14 through the material stack 10 includes forming a doped semiconductor material 15 in the openings 14 through the material stack 10, wherein the doped semiconductor material 15 extends from the surface of the semiconductor substrate 5 past an interface between the first dielectric layer 11 and the second dielectric layer 12 and forming an intrinsic semiconductor material 16 in the openings 14 on the doped semiconductor material 15.

The doped semiconductor material 15 is formed in direct contact with the surfaces of the semiconductor substrate 5 exposed by the openings 14 in the material stack 10 and may serve as a punch through stopper to electrically isolate the later formed source and drain regions of the finFET semiconductor device or trigate semiconductor device from the semiconductor substrate 5. Each of the doped semiconductor materials 15 that can provide the punch through stopper can be formed using epitaxial deposition and an in-situ doping process. The terms "epitaxial growth and/or deposition" and "epitaxially formed" mean the growth of a semiconductor material, e.g., doped semiconductor material 15, on a deposition surface of a semiconductor material, e.g., semiconductor substrate 5, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, the depositing atoms have no surface to align to, resulting in the formation of polycrystalline or amorphous silicon instead of single crystal silicon. The temperature for epitaxial silicon deposition typically ranges from 450° C. to 900° C. Although higher temperature typically results in faster deposition, the faster deposition may result in crystal defects and film cracking.

In one embodiment, the epitaxially formed doped semiconductor material 15 may be composed of silicon-containing material. A number of different sources may be used for the deposition of epitaxial silicon. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The temperature for epitaxial silicon deposition typically ranges from 250° C. to 900° C. Although higher temperature typically results in faster deposition, the faster deposition may result in crystal defects and film cracking.

In another embodiment, the epitaxially formed doped semiconductor material 15 may be composed of germanium (Ge). A number of different sources may be used for the deposition of epitaxial germanium. In some embodiments, the germanium containing gas sources for epitaxial growth include germane ($GeH_4$), digermane ($Ge_2H_6$), trigermane ($Ge_3H_6$), halogermane, dichlorogermane, trichlorogermane, tetrachlorogermane and combinations thereof.

In yet another embodiment, the epitaxially formed doped semiconductor material 15 is composed of a germanium-containing material, such as silicon germanium (SiGe). A number of different sources may be used for the deposition of epitaxial silicon germanium. In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, trigermane, halogermane, dichlorogermane, trichlorogermane, tetrachlorogermane and combinations thereof. The germanium content of the epitaxial layer of silicon germanium may range from 5% to 70%, by atomic weight %. In another embodiment, the germanium content of the epitaxial layer of silicon germanium may range from 10% to 60%.

In an even further embodiment, the epitaxially formed doped semiconductor material 15 is composed of silicon doped with carbon (Si:C). The carbon (C) content of the epitaxial grown silicon doped with carbon may range from 0.3% to 4%, by atomic weight %. In another embodiment, the carbon content of the epitaxial grown silicon doped with carbon may range from 0.5% to 2.7%.

It is noted that the above examples of compositions for the doped semiconductor material 15 are provided for illustrative purposes only, as other semiconductor materials may be employed in the doped semiconductor material 15, such as compound semiconductors including type III-V semiconductor materials.

The material of the doped semiconductor material 15 may be the same base material as the semiconductor substrate 5. For example, not considering dopants that dictate the conductivity type of the material or that provide punch through resistance, the doped semiconductor material 15 and the semiconductor substrate 5 may have identical materials. In one embodiment, the doped semiconductor material 15 and the semiconductor substrate 5 may both be composed of silicon (Si). In another example, the doped semiconductor material 15 and the semiconductor substrate 5 may both be composed of germanium (Ge) or silicon germanium (SiGe).

To provide for adequate punch through resistance, the semiconductor material that provides the epitaxially formed doped semiconductor material 15 is doped with a dopant, such as carbon (C) or a dopant having a conductivity type that is opposite the conductivity type of the subsequently formed source and drain regions. As used herein, the term "conductivity type" denotes a semiconductor material being p-type or n-type. In one example, when the subsequently formed source and drain regions have a p-type conductivity, the doped semiconductor material 15 has an n-type conductivity. In another example, when the subsequently formed source and drain regions have an n-type conductivity, the doped semiconductor material 15 has a p-type conductivity. As used herein, "n-type" refers to the addition of impurities that contributes free electrons to an intrinsic semiconductor. In a type IV semiconductor, such as germanium (Ge) and/or silicon (Si), examples of n-type dopants, i.e., impurities, include but are not limited to, antimony (Sb), arsenic (As) and phosphorous (P). As used herein, "p-type" refers to the addition of impurities to an intrinsic semiconductor that creates deficiencies of valence electrons (i.e. holes). In a type IV semiconductor, such as germanium (Ge) and/or silicon (Si), examples of p-type dopants, i.e., impurities, include but are not limited to, boron (B), aluminum (Al), gallium (Ga) and indium (In).

The dopant that provides the punch through resistance of the doped semiconductor material 15 may be introduced using an in-situ doping process or using ion implantation. By "in-situ" it is meant that the dopant that provides the conductivity type of the material layer is introduced as the material layer is being formed or deposited, e.g., during the epitaxial deposition process. For example, when doping the doped semiconductor material concurrently with the epitaxial growth process, a gas source for the dopant is introduced to the semiconductor material being grown simultaneously with the gas source that provides the precursor for epitaxially forming the semiconductor material. In-situ doping is differentiated from ion implantation that occurs after the semiconductor material has been formed. In one example, the gaseous dopant sources for in-situ doping include $PH_3$, $B_2H_6$, $AsH_3$ and combinations thereof.

In one embodiment, when the doped semiconductor material 15 is doped with carbon (C), the dopant concentration ranges from 1E20 atoms/cm$^3$ to 2E21 atoms/cm$^3$. In another embodiment, when the doped semiconductor material 15 is doped with carbon (C), the dopant concentration ranges from 3E20 atoms/cm$^3$ to 1E21 atoms/cm$^3$. When the doped semiconductor material 15 is doped with an n-type or p-type dopant the concentration of the dopant ranges from 2E17 atoms/cm$^3$ to 5E19 atoms/cm$^3$. In another embodiment, when the doped semiconductor material 15 is doped with an n-type or p-type dopant the concentration of the dopant ranges from 2E18 atoms/cm$^3$ to 1E19 atoms/cm$^3$. In one embodiment, the doped material 15 may comprise both carbon and an n-type dopants. In one embodiment, the doped material 15 may comprise both carbon and a p-type dopants.

In one embodiment, a first surface S1 of the doped semiconductor material 15 that is opposite a second surface S2 of the doped semiconductor material 15 that is in contact with the semiconductor substrate 5 is coplanar with an interface between the third dielectric layer 13 and the second dielectric layer 12. In another embodiment, the first surface S1 of the doped semiconductor material 15 is present between the interface between the third dielectric layer 13 and the second dielectric layer 12 and the interface between the first dielectric layer 11 and the second dielectric layer 12. In one embodiment, the doped semiconductor material 15 has a thickness T1 ranging from 5 nm to 100 nm, as measured from the upper surface of the semiconductor substrate 5. In another embodiment, the doped semiconductor material 15 has a thickness T1 ranging from 30 nm to 80 nm. It is noted that the above thicknesses are provided for illustrative purposes only, as any thickness for the doped semiconductor material 15 may be considered so long as the thickness of the doped semiconductor material 15 provides for punch through resistance.

Still referring to FIG. 3A, after forming the doped semiconductor material 15, an intrinsic semiconductor material 16 is deposited that fills the openings 14. The term "intrinsic semiconductor", also called an undoped semiconductor, is a substantially pure semiconductor without any significant dopant species present. The number of charge carriers in the intrinsic semiconductor is determined by the properties of the material itself instead of the amount of impurities, i.e., dopants. Typically, in intrinsic semiconductors the number of excited electrons and the number of holes are equal (n=p). Similar to the doped semiconductor material 15, the intrinsic semiconductor material 16 may be composed of silicon (Si), germanium (Ge), silicon germanium (SiGe), silicon doped with carbon (Si:C) and combinations thereof. The intrinsic semiconductor material 16 may also be composed of compound semiconductors, such as type III-IV semiconductors. The intrinsic semiconductor material 16 may be composed of the same or a different base semiconductor material as the doped semiconductor material 15. The intrinsic semiconductor material 16 may be formed using an epitaxial deposition process that is similar to the epitaxial deposition process that is described above for forming the doped semiconductor material 15. Therefore, the above description for forming the doped semiconductor material 15 is suitable for forming the intrinsic semiconductor material 16 with the exception that the doped semiconductor material 15 may be in-situ doped with carbon, or an n-type or p-type dopant, and the intrinsic semiconductor material 16 is not doped with carbon, or an n-type or p-type dopant, at this stage of the method. The intrinsic semiconductor material 16 provides the fin structure for the later formed semiconductor devices. Therefore, some regions of the intrinsic semiconductor material 16 may be subsequently doped to provide the source and drain regions of the device. At this stage of the disclosure, the intrinsic semiconductor material 16 is free of intentional dopants such as n-type or p-type dopants. N-type or p-type dopants with the intrinsic semiconductor material 16 at this stage of the present disclosure may be limited to no greater than $5E18$ atoms/cm$^3$. In one example, the intrinsic semiconductor material 16 is completely free of n-type or p-type dopants.

The intrinsic semiconductor material 16 may fill the openings 14, and an overfill portion of the intrinsic semiconductor material 16 may extend onto a surface of the third dielectric layer 13 that is adjacent to the opening 14. The overfill portion of the intrinsic semiconductor material 16 may be removed using a planarization process, wherein following the planarization process the upper surface of the intrinsic semiconductor material 16 is coplanar with the upper surface of the third dielectric layer 13. In one embodiment, the planarization process that is employed to remove the overfill portion of the intrinsic semiconductor material 16 is chemical mechanical planarization (CMP).

Figure 3B:
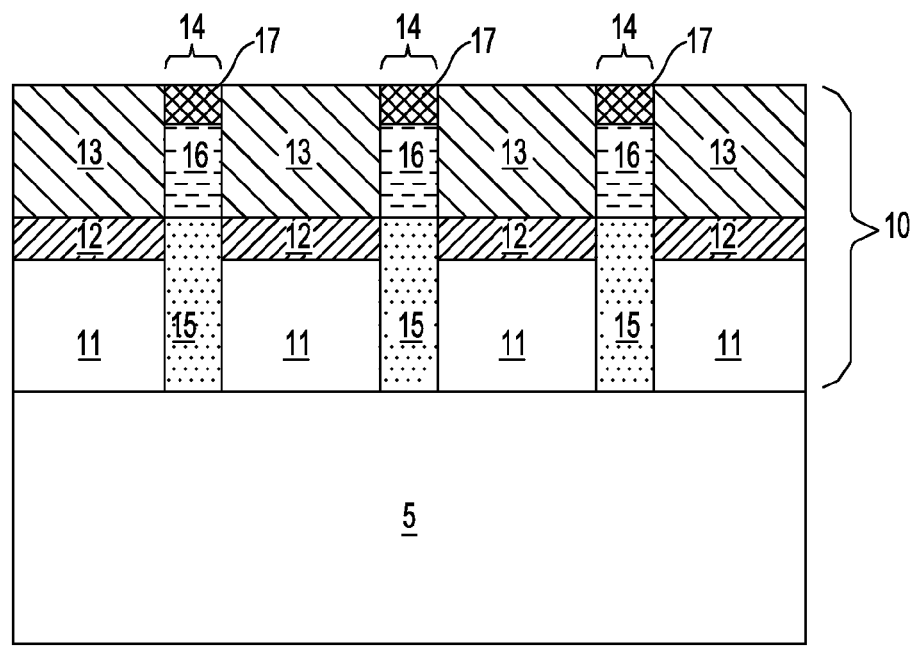
FIG. 3B is a side cross-sectional view depicting forming a semiconductor material in the openings through the material stack and forming a dielectric cap on an upper surface of the semiconductor material, in accordance with one embodiment of the present disclosure.

FIG. 3B depicts an optional step of the present method that may be employed when the semiconductor device that is formed form the intrinsic semiconductor material 16 is a finFET semiconductor device. FIG. 3B depicts one embodiment of forming a dielectric cap 17 on an upper surface of the semiconductor material, e.g., the intrinsic semiconductor material 16. The dielectric cap 17 may be formed using deposition or thermal growth. For example, in one embodiment in which the intrinsic semiconductor material 16 is composed of silicon (Si), the dielectric cap 17 may be silicon oxide ($SiO_2$) that is formed by thermal annealing in an oxygen-containing atmosphere. The dielectric cap 17 may have a thickness ranging form 2 nm to 20 nm. The composition of the dielectric cap 17 is not limited to silicon oxide ($SiO_2$), as other dielectrics, e.g., silicon nitride or hafnium oxide, may be employed for the dielectric cap 17.

Figure 4A:
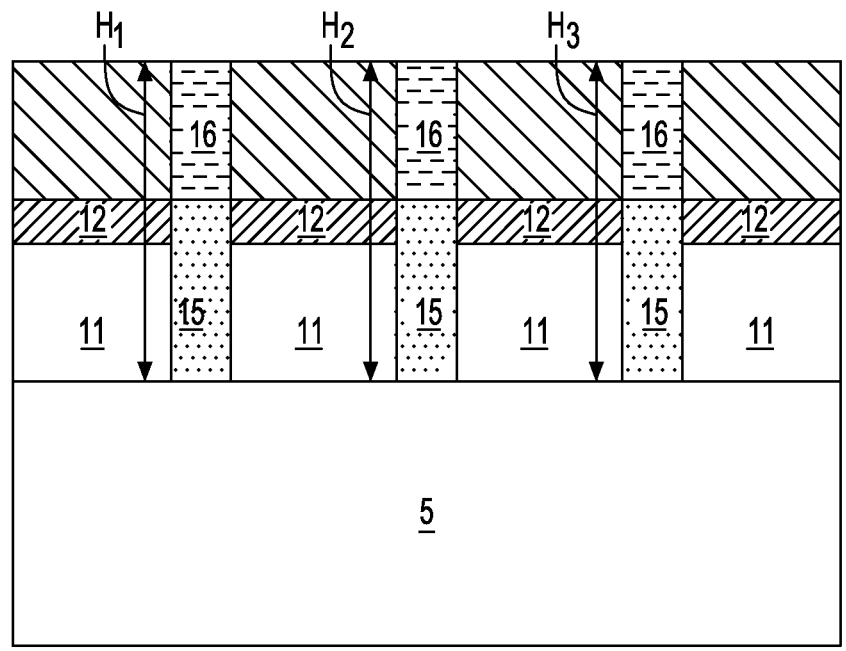
FIG. 4A is a side cross-sectional view depicting removing a third dielectric layer of the material stack depicted in FIG. 3A selective to the semiconductor material and the second dielectric layer that includes the high-k dielectric, in accordance with one embodiment of the present disclosure.

FIG. 4A depicts removing the third dielectric layer 13 of the material stack depicted in FIG. 3A selectively to the semiconductor material, i.e., intrinsic semiconductor material 16 and doped semiconductor material 15, and the second dielectric layer 12 that includes the high-k dielectric, e.g., hafnium oxide ($HfO_2$). The third dielectric layer 13 may be removed using a selective etch process. The etch may be an isotropic etch or an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, when the third dielectric layer 13 is silicon nitride, the second dielectric layer 12 is hafnium oxide ($HfO_2$), and the intrinsic semiconductor material 16 is silicon (Si), the etch chemistry for removing the third dielectric layer 13 selectively to the second dielectric layer 12 and the intrinsic semiconductor material 16 is a wet etch solution containing hot phosphoric acid.

Figure 4B:
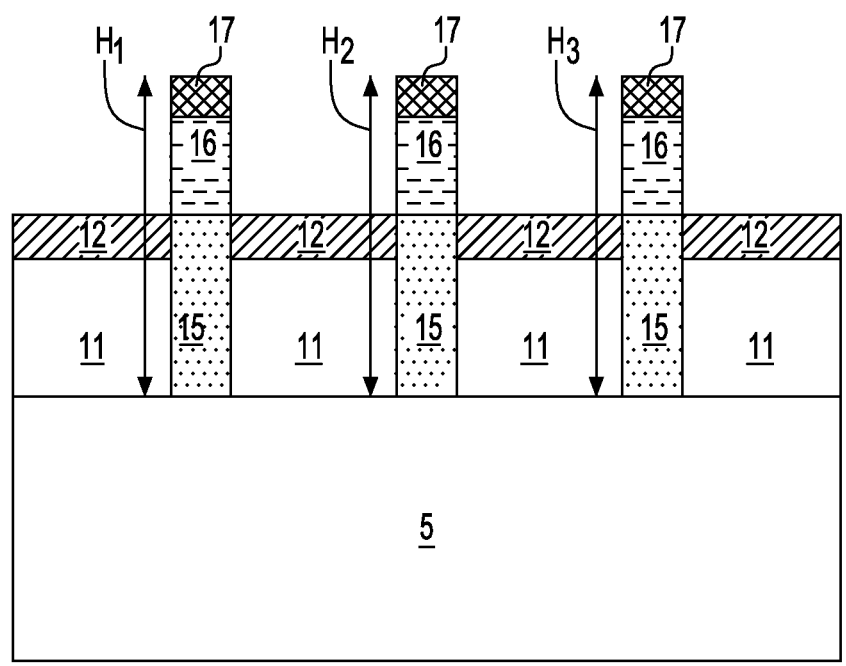
FIG. 4B is a side cross-sectional view depicting removing a third dielectric layer of the material stack depicted in FIG. 3B selective to the dielectric cap and the second dielectric layer that includes the high-k dielectric, in accordance with one embodiment of the present disclosure.

FIG. 4B depicts removing the third dielectric layer 13 of the material stack depicted in FIG. 3B selectively to the dielectric cap 17 and the second dielectric layer 12 that includes the high-k dielectric, e.g., hafnium oxide ($HfO_2$). The method for removing the third dielectric layer 13 depicted in FIGS. 3B and 4B, is similar to removing the third dielectric layer 13 depicted in FIGS. 3A and 3B. In one embodiment, when the third dielectric layer 13 is silicon nitride, the second dielectric layer 12 is hafnium oxide ($HfO_2$), and the dielectric cap 17 is silicon oxide, the etch chemistry for removing the third dielectric layer 13 selectively to the second dielectric layer 12 and the dielectric cap 17 is a wet etch solution containing hot phosphoric acid.

In one embodiment, the second dielectric layer 12 that includes the high-k dielectric, e.g., hafnium oxide (HfO2), provides an etch stop layer (also referred to as embedded etch stop layer) for removing the third dielectric layer 13.

Following removal of the third dielectric layer 13, the sidewalls of the intrinsic semiconductor material 16 are exposed. The intrinsic semiconductor material 16 provides the fin structure for the subsequently formed semiconductor devices. Because the thickness of the intrinsic semiconductor material 16 that is formed in the openings in the material stack is set by an epitaxial deposition process in combination with a planarization step to make the upper surface of the intrinsic semiconductor material 16 coplanar with the third dielectric layer 13, and the intrinsic semiconductor material 16 is exposed by removing the third dielectric layer 11 of the material stack with an etch that does not remove the material of the intrinsic semiconductor material 16, the height of the intrinsic semiconductor material 16 from the semiconductor substrate for each of the openings is substantially the same. Therefore, the height of the fin structures that are provided by the intrinsic semiconductor material 16 is substantially the same. By "substantially the same" it is meant that the height H1, H2, H3 of each portion of the intrinsic semiconductor material 16, as measured from the upper surface of the semiconductor substrate 5, is within +/−10 nm or less for one another. For example, the difference in height H1, H2, H3 of each portion of the intrinsic semiconductor material 16 may be +/−1 nm to +/−10 nm. In another example, the difference in height H1, H2, H3 of each portion of the intrinsic semiconductor material 16 may be +/−1 nm to +/−10 nm. In yet another example, the difference in height H1, H2, H3 of each portion of the intrinsic semiconductor material 16 may be +/−5 nm or less from one another. In another example, the difference in height H1, H2, H3 of each portion of the intrinsic semiconductor material 16 may be +/−1 nm to +/−5 nm.

Figure 5A:
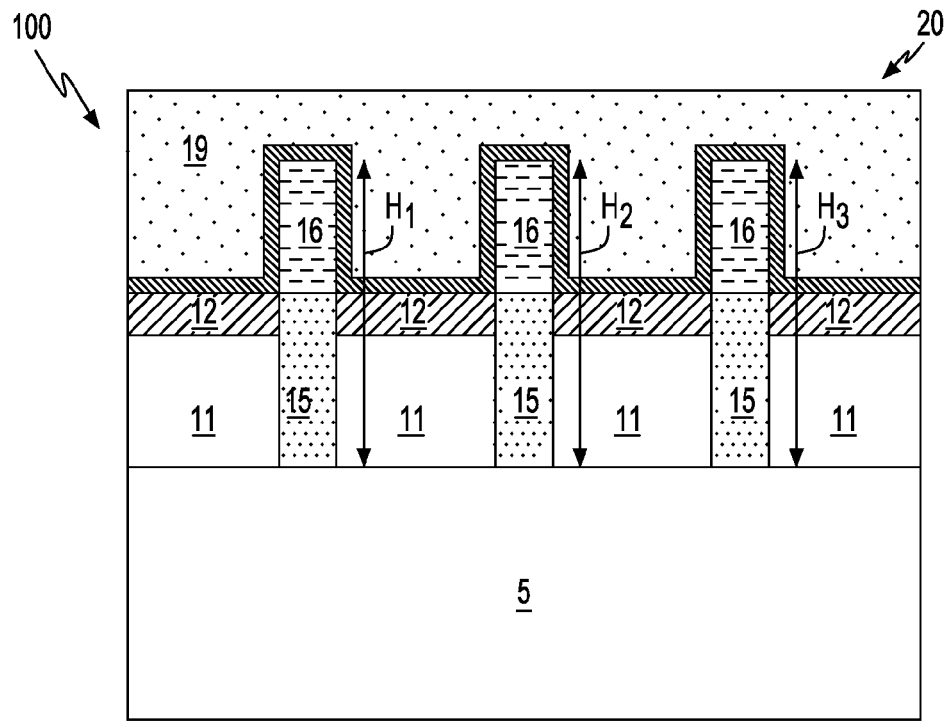
FIG. 5A is a side cross-sectional view depicting forming a gate structure on the structure depicted in FIG. 4A, in which the semiconductor material that the gate structure is formed on is a fin structure, and the semiconductor device formed is a tri-gate semiconductor device, in accordance with one embodiment of the present disclosure.
Figure 5B:
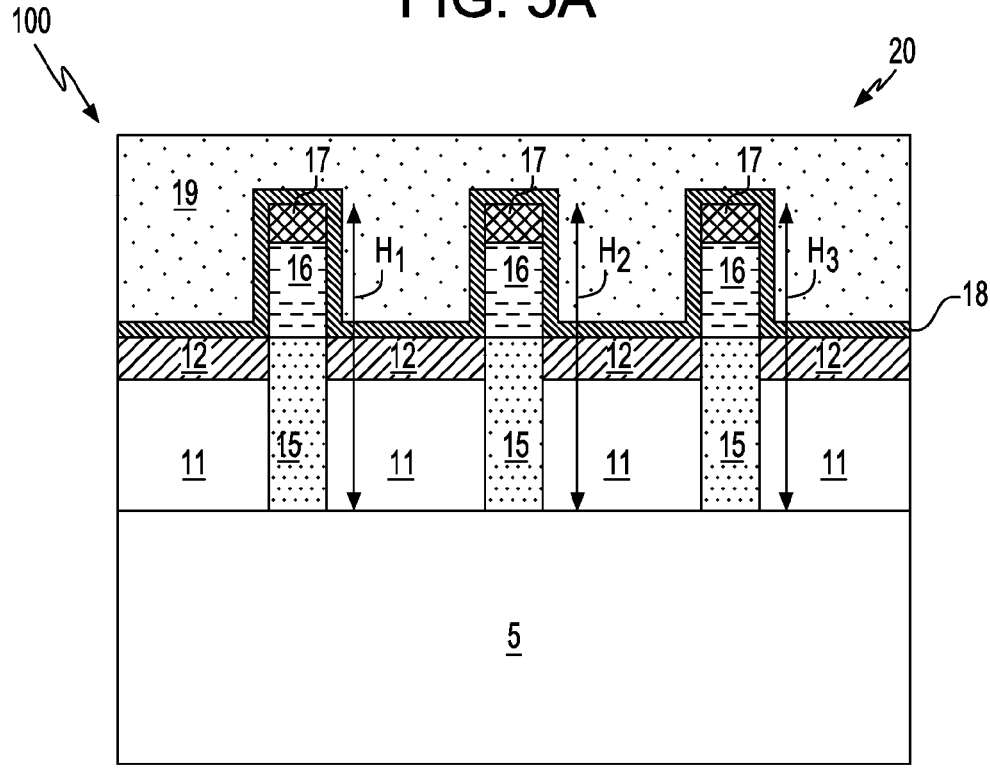
FIG. 5B is a side cross-sectional view depicting forming a gate structure on the structure depicted in FIG. 4B, in which the semiconductor material that the gate structure is formed on is a fin structure, and the semiconductor device formed is a finFET semiconductor device, in accordance with one embodiment of the present disclosure.

FIGS. 5A and 5B depict forming a gate structure 20 on the channel portion of the intrinsic semiconductor material 16. The gate structure 20 controls output current, i.e., flow of carriers in the channel portion of a semiconducting device, such as a field effect transistor (FET), through electrical or magnetic fields. The channel portion is the region between the source region and the drain region of a semiconductor device that becomes conductive when the semiconductor device is turned on. Typically, each gate structure 20 includes at least one gate dielectric 18 that is formed on the channel portion of the intrinsic semiconductor material 16, and at least one gate conductor 19 that is formed on the at least one gate dielectric 18. The gate structure 20 may be formed by forming blanket material layers for the at least one gate dielectric 18 and the at least one gate conductor 19 to provide a gate stack, and patterning and etching the gate stack to provide the gate structures 20. The gate structures 20 can be formed utilizing photolithography and etch process steps.

In the embodiment depicted by FIG. 5A, the at least one gate dielectric 18 is typically positioned on the sidewalls of the channel portion of the intrinsic semiconductor material 16 and the upper surface of the intrinsic semiconductor material 16. In the embodiment depicted in FIG. 5A, the semiconductor device formed can be a tri-gate semiconductor device. Referring to FIG. 5B, the at least one gate dielectric 18 is typically positioned on the sidewalls of the channel portion of the intrinsic semiconductor material, but it separated from the upper surface of the intrinsic semiconductor material 16 by a dielectric cap 17. In the embodiment depicted in FIG. 5B, the semiconductor device being formed can be a finFET semiconductor device. The at least one gate dielectric 18 may be formed by a thermal growth process such as, e.g., oxidation, nitridation or oxynitridation. The at least one gate dielectric 18 may also be formed by a deposition process such as, e.g., chemical vapor deposition (CVD), plasma-assisted CVD, metal organic chemical vapor deposition (MOCVD), atomic layer deposition (ALD), evaporation, reactive sputtering, chemical solution deposition and other like deposition processes.

The at least one gate dielectric 18 may be comprised of an insulating material having a dielectric constant of 4.0 or greater. In another embodiment, the at least one gate dielectric 18 is comprised of an insulating material having a dielectric constant greater than 7.0. The dielectric constants mentioned herein are relative to a vacuum at room temperature. In one embodiment, the at least one gate dielectric 19 employed in the present disclosure may include, but is not limited to, an oxide, nitride, oxynitride and/or silicates including metal silicates, aluminates, titanates and nitrides. In one example, when the at least one gate dielectric 18 is comprised of an oxide, the oxide may be selected from the group including, but not limited to $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of each of the at least one gate dielectric 18 may vary, but typically, each of the at least one gate dielectric 18 has a thickness ranging from 1 nm to 10 nm. In another embodiment, each of the at least one gate dielectric 18 may have a thickness ranging from 1 nm to 3 nm.

The at least one gate conductor 19 of the gate structures 20 can be formed atop the at least one gate dielectric 18 utilizing a deposition process, such as physical vapor deposition (PVD), CVD or evaporation. The at least one gate conductor 19 may be composed of polysilicon, SiGe, a silicide, a metal or a metal-silicon-nitride, such as Ta-Si-N. Examples of metals that can be used as at least one gate conductor 19 include, but are not limited to Al, W, Cu, Ti or other like conductive metals. In one embodiment, the at least one gate conductor 19 comprises Ti, Zr, Hf, V, Nb, Ta, TiN, TaN or a combination thereof. The at least one gate conductor 19 may be doped or undoped. The physical thickness of the at least one gate conductor 19 may range from 1 nm to 10 nm. In another embodiment, the at least one gate conductor 19 has a thickness ranging from 1 nm to 3 nm. A spacer (not depicted) may be formed in direct contact with the sidewalls of the gate structures 20. The spacer may be formed by depositing a conformal layer of dielectric material, such as oxides, nitrides or oxynitrides followed by etching. The spacer (not depicted) may have a width ranging from 1 nm to 10 nm, typically ranging from 1 nm to 5 nm.

Figure 6:
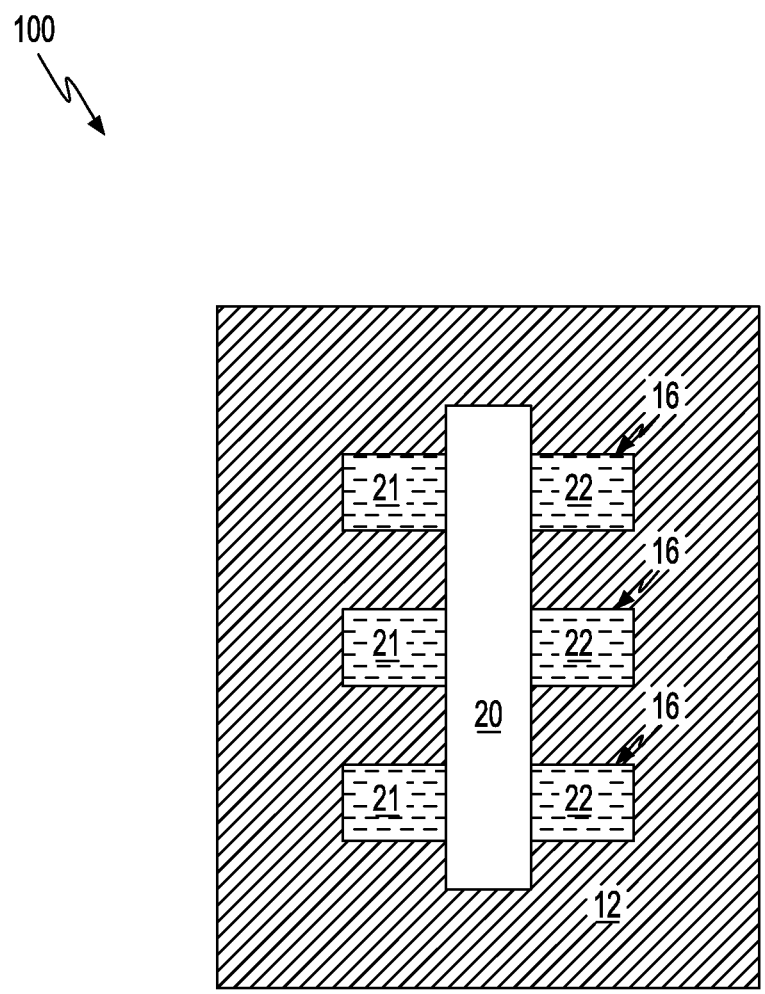
FIG. 6 is a top down perspective view of the semiconductor device that is depicted in FIGS. 5A and 5B, in accordance with one embodiment of the present disclosure.

Referring to FIGS. 5A, 5B and 6, in some embodiments, source regions 21 and drain regions 22 may then be formed on the exposed sidewalls of the intrinsic semiconductor material 16 that provides the fin structures. The source and drain regions 21, 22 can be formed in the intrinsic semiconductor material 16 on opposing sides of the gate structures 20 using ion implantation. In another embodiment, the source and drain regions 21, 22 may be formed by forming an in-situ doped material on the exposed portions of the intrinsic semiconductor material 16 and diffusing dopant from in-situ doped material into the sidewalls of the intrinsic semiconductor material 16. In one embodiment, the source and drain regions 21, 22 may be doped to an n-type conductivity. In this embodiment, the finFET or trigate semiconductor device that is formed on the fin structure provided by the intrinsic semiconductor material 16 is an n-type finFET, as depicted in FIG. 5B or an n-type trigate semiconductor device, as depicted in FIG. 5A. In one embodiment, the source and drain regions 21, 22 may by doped to a p-type conductivity. In this embodiment, the finFET or trigate semiconductor device that is formed on the fin structure provided by the intrinsic semiconductor material 16 is a p-type finFET, as depicted in FIG. 5B or a p-type trigate semiconductor device, as depicted in FIG. 5A.

Still referring to FIGS. 5A, 5B and 6, and in another aspect, a semiconductor device 100 is provided that includes a semiconductor substrate 5 of a first semiconductor material and a plurality of punch through doped semiconductor structures (doped semiconductor material 15) in contact with the semiconductor substrate 5, in which adjacent punch through doped semiconductor structures are separated from one another by dielectric isolation material that is provided by the second dielectric layer 12 and the first dielectric layer 11. In the method described above, the second dielectric layer 12 and the first dielectric layer 11 are formed before the doped semiconductor material 15 that provides the plurality of punch through doped semiconductor structures. Therefore, filling the trenches between and separating the doped semiconductor material 15 is not a concern, and the dielectric isolation material that is provided by the second dielectric layer 12 and the first dielectric layer 11 is continuous without the voids that are typically encountered when high aspect ratio trenches are filled using deposition processes, such as chemical vapor deposition (CVD). The semiconductor device 100 further includes a plurality of fin structures of a second semiconductor material that are provided by the intrinsic semiconductor material 16. Each fin structure of the plurality of fin structures is present on a punch through doped semiconductor structure. Each fin structure, i.e., intrinsic semiconductor material 16, of the plurality of fin structures has a substantially same height H1, H2, H3, as measured from the surface of the semiconductor substrate 5. In one embodiment, each fin structure of the plurality of fin structures having the substantially same height has a differential in height of +/−10 nm or less. In another embodiment, each fin structure of the plurality of fin structures having the substantially same height has a differential in height of +/−5 nm or less. Although FIGS. 5A, 5B and 6 only depict three fin structures, i.e., three pieces of intrinsic semiconductor material 16, it is noted that the present disclosure is applicable to any number of fin structures. In one embodiment, a gate structure 20 present on a channel portion of each of the fin structures, and source and drain regions 21, 22 are present on opposing sides of the gate structure 20.

Referring to FIGS. 5A, 5B and 6, and in one embodiment, the first semiconductor material of the semiconductor substrate 5 is different from the second semiconductor material of the plurality of fin structures, i.e., intrinsic semiconductor material 16. The first semiconductor material can be selected from the group consisting of silicon, germanium, silicon germanium, silicon doped with carbon (Si:C), III-V or a combination thereof, and the second semiconductor material can be selected from the group consisting of silicon, germanium, silicon germanium, silicon doped with carbon (Si:C), III-V or a combination thereof. In another embodiment, the first semiconductor material of the semiconductor substrate 5 is the same as the second semiconductor material of the plurality of fin structures, i.e., intrinsic semiconductor material 16.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
   a semiconductor substrate of a first semiconductor material;
   a plurality of punch through doped semiconductor structures in contact with the semiconductor substrate, in which adjacent punch through doped semiconductor structures are separated from one another by a dielectric isolation material, wherein the dielectric isolation material comprises a high-k dielectric layer having an upper surface that is substantially coplanar with an upper surface of the plurality of the punch through doped semiconductor structures;
   a plurality of fin structures of a second semiconductor material, wherein each fin structure of the plurality of fin structures is present on a punch through doped semiconductor structure of the plurality of punch through doped semiconductor structures, wherein said each fin structure of the plurality of fin structures has a substantially same height as measured from the surface of the semiconductor substrate; and
   a gate structure present on a channel portion of said each fin structure of the plurality of fin structures.

2. The semiconductor device of claim 1, wherein the first semiconductor material of the semiconductor substrate is different from the second semiconductor material of the plurality of fin structures.

3. The semiconductor device of claim 1, wherein the first semiconductor material is selected from the group consisting of silicon, germanium silicon germanium, silicon doped with carbon (Si:C), III-V semiconductors and a combination thereof, and the second semiconductor material is selected from the group consisting of silicon, germanium silicon germanium, silicon doped with carbon (Si:C), III-V semiconductors and a combination thereof.

4. The semiconductor device of claim 1, wherein the plurality of punch through doped semiconductor structures is comprised of a same semiconductor material as the second semiconductor material of the plurality of fin structures.

5. The semiconductor device of claim 1, wherein the high-k dielectric layer is a hafnium containing material that is selected from the group consisting of hafnium oxide, hafnium silicon oxide, and hafnium silicon oxynitride and combinations thereof.

6. The semiconductor device of claim 1, wherein each punch through doped semiconductor structure of the plurality of punch through doped semiconductor structures is doped with carbon or is doped to have an opposite conductivity type than source and drain regions that are present on opposing sides of the channel portion for each fin structure of the plurality of fin structures.

7. The semiconductor device of claim 1, wherein said each fin structure of the plurality of fin structures having the substantially same height comprises a differential in height of +/−10 nm or less.

8. The semiconductor device of claim 1, wherein said each fin structure of the plurality of fin structures having the substantially same height comprises a differential in height of +/−5 nm or less.

9. The semiconductor device of claim 1, wherein the gate structure comprises a gate dielectric on sidewall and upper surfaces of said each fin structure, and a gate conductor on the gate dielectric.

10. The semiconductor device of claim 8, wherein the semiconductor device is a tri-gate semiconductor device.

11. The semiconductor device of claim 1, further comprising a dielectric cap on an upper surface of said each fin structure of the plurality of the fin structures.

12. The semiconductor device of claim 10, wherein the gate structure on the channel portion of the semiconductor material comprises a gate dielectric on sidewall of said each fin structure and on the dielectric cap, and a gate conductor on the gate dielectric.

13. A semiconductor device comprising:
    a semiconductor substrate of a first semiconductor material;
    a plurality of punch through doped semiconductor structures in contact with the semiconductor substrate, in which adjacent punch through doped semiconductor structures are separated from one another by a dielectric isolation material, wherein the dielectric isolation material comprises a layered structure of an oxide layer that is in contact with the semiconductor substrate and a high-k dielectric layer that is present on the oxide layer;
    a plurality of fin structures of a second semiconductor material, wherein each fin structure of the plurality of fin structures is present on a punch through doped semiconductor structure of the plurality of punch through doped semiconductor structures, wherein said each fin structure of the plurality of fin structures has a substantially same height as measured from the surface of the semiconductor substrate; and
    a gate structure present on a channel portion of said each fin structure of the plurality of fin structures.

14. A semiconductor device comprising:
    a semiconductor substrate of a first semiconductor material;
    a plurality of punch through doped semiconductor structures in contact with the semiconductor substrate, in which adjacent punch through doped semiconductor structures are separated from one another by a dielectric isolation material;
    a plurality of fin structures of a second semiconductor material, wherein each fin structure of the plurality of fin structures is present on a punch through doped semiconductor structure of the plurality of punch through doped semiconductor structures, wherein said each fin structure of the plurality of fin structures has a substantially same height as measured from the surface of the semiconductor substrate, and wherein each of the punch through doped semiconductor structure of the plurality of punch through doped semiconductor structures is doped with carbon or is doped to have an opposite conductivity type than source and drain regions that are present on opposing sides of the channel portion for each fin structure of the plurality of fin structures; and a gate structure present on a channel portion of said each fin structure of the plurality of fin structures.

* * * * *